(12) United States Patent
Zhang

(10) Patent No.: US 9,082,674 B2
(45) Date of Patent: Jul. 14, 2015

(54) MICROELECTRONIC PACKAGE WITH STRESS-TOLERANT SOLDER BUMP PATTERN

(71) Applicant: NVIDIA CORPORATION, Santa Clara, CA (US)

(72) Inventor: Leilei Zhang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/053,450

(22) Filed: Oct. 14, 2013

(65) Prior Publication Data

US 2015/0102483 A1 Apr. 16, 2015

(51) Int. Cl.
*H01L 23/48* (2006.01)
*H01L 23/52* (2006.01)
*H01L 29/40* (2006.01)
*H01L 23/00* (2006.01)
*H01L 23/12* (2006.01)
*H01L 23/498* (2006.01)

(52) U.S. Cl.
CPC .............. *H01L 24/14* (2013.01); *H01L 23/12* (2013.01); *H01L 23/49811* (2013.01); *H01L 24/81* (2013.01); *H01L 24/92* (2013.01)

(58) Field of Classification Search
CPC ... H01L 23/49811; H01L 24/12; H01L 24/14; H01L 24/81; H01L 24/92
USPC ........................................................ 257/737
See application file for complete search history.

(56) References Cited

U.S. PATENT DOCUMENTS

2014/0110860 A1* 4/2014 Choi et al. .................... 257/774

* cited by examiner

*Primary Examiner* — David S Blum
(74) *Attorney, Agent, or Firm* — Artegis Law Group, LLP

(57) ABSTRACT

A microelectronic package includes larger diameter solder bumps and smaller diameter solder bumps for coupling an interposer to a packaging substrate. The larger diameter solder bumps are positioned on a peripheral surface of the interposer and the smaller diameter solder bumps are positioned on a center surface of the interposer. The solder bumps positioned in the peripheral region can more reliably withstand the higher mechanical stresses that occur in this peripheral region during operation of the microelectronic package.

20 Claims, 5 Drawing Sheets

MICROELECTRONIC PACKAGE WITH STRESS-TOLERANT SOLDER BUMP PATTERN

BACKGROUND OF THE INVENTION

1. Field of the Invention

Embodiments of the present invention relate generally to integrated circuit chip packaging and, more specifically, to a microelectronic package with a stress-tolerant solder bump pattern.

2. Description of the Related Art

In the packaging of integrated circuit (IC) chips, the so-called "2.5D" packaging approach has been used for various multi-chip packages, such as field-programmable gate arrays (FPGAs), central processing units (CPUs), or graphics processing units (GPUs) packaged together with one or more dedicated memory chips. In the 2.5D packaging approach, two or more IC chips are mounted on a silicon interposer substrate and electrical connections between the IC chips are formed on the silicon interposer. In addition, the interposer substrate is configured with through-silicon vias (TSVs), which are vertical electrical pathways that pass through the interposer substrate and facilitate electrical connection of IC chips mounted on one side of the interposer to a packaging substrate mounted on the other side of the interposer. Compared to wire-bonded IC chips, TSVs offer reduced parasitic capacitance, better performance, reduced power loss, and a require less area.

Because 2.5D packaging enables multiple IC chips to be incorporated into a single package, and because the IC chips are typically distributed over a silicon interposer without vertical stacking, the silicon interposer is essentially a very large chip. Consequently, significant mechanical stresses can occur in a 2.5D chip package during operation due to the significant mismatch in coefficient of thermal expansion of the silicon interposer and the organic packaging substrate. This mechanical stress can affect reliability of such IC packages by causing failure of solder bumps connecting the interposer to the packaging substrate, including solder bump cracking and delamination of solder bumps from interface layers.

Accordingly, there is a need in the art for an IC package that can better withstand the increased mechanical stresses that can occur when large surface area interposers are used.

SUMMARY OF THE INVENTION

One embodiment of the present invention sets forth a microelectronic package having a semiconductor die, a first group of solder bumps, and a second group of solder bumps. The semiconductor die is mounted on a first side of an interposer that is formed from a semiconductor substrate. The first group of solder bumps is coupled to a peripheral region of a second side of the interposer, wherein the first side of the interposer is opposite to the second side of the interposer, and the second group of solder bumps is coupled to a center region of the second side of the interposer. Each solder bump in the first group has a diameter substantially equal to a first value and each solder bump in the second group has a diameter substantially equal to a second value, where the first value is greater than the second value.

One advantage of the above-described embodiment is that the reliability of a microelectronic package can be improved. Specifically, the higher mechanical stresses that are caused at the periphery of a microelectronic package by thermal expansion mismatch between an interposer substrate and a packaging substrate are mechanically supported by larger diameter solder bumps. These larger diameter solder bumps can withstand greater mechanical stresses and significantly increase the reliability of the microelectronic package.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
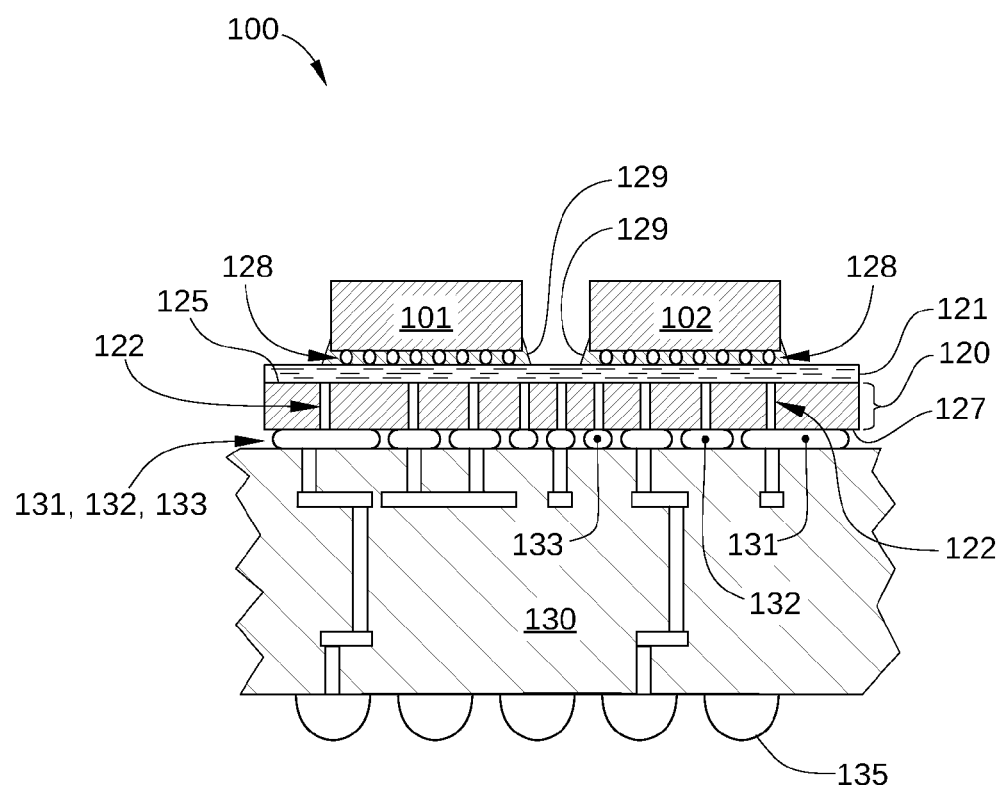
FIG. 1 is a schematic cross-sectional view of a microelectronic package, according to one embodiment of the present invention.

FIG. 1 is a schematic cross-sectional view of a microelectronic package 100, according to one embodiment of the present invention. Microelectronic package 100 includes integrated circuit (IC) chips 101 and 102, an interposer 120, and a packaging substrate 130. Microelectronic package 100 is configured to electrically and mechanically connect the IC chips 101 and 102 and any other ICs mounted on interposer 120 to a printed circuit board or other mounting substrate (not shown) external to microelectronic package 100. In addition, microelectronic package 100 protects IC chips 101 and 102 from ambient moisture and other contamination and minimizes mechanical shock and stress thereon. For clarity, some elements of IC system 100 are omitted from FIG. 2, such as a heat spreader, over-molding that may be used to encapsulate IC chips 101 and 102, etc.

Each of IC chips 101 and 102 is a semiconductor chip, such as a central processing unit (CPU), a graphics processing unit (GPU), an application processor or other logic device, a memory chip, a global positioning system (GPS) chip, a radio frequency (RF) transceiver chip, a Wi-Fi chip, a system-on-chip, or any semiconductor chip that is suitable for mounting on interposer 120. Thus, IC chips 101 and 102 may include any IC chips that may benefit from being assembled together in a single microelectronic package. In some embodiments, IC chip 101 is a logic chip, such as a CPU or GPU, and IC chip 102 is a memory chip associated with IC chip 101. IC chips 101 and 102 are mounted on interposer 120, and may be electrically coupled to interposer 120 using solder microbumps 128 or any other technically feasible approach.

An underfill material 129 may be used to protect the solder microbumps 128 or other electrical connections between IC chips 101 and 102 and interposer 120.

As shown, IC chips 101 and 102 are electrically coupled to each other with electrical interconnects formed in redistribution layer (RDL) 121 on interposer 120. The electrical interconnects of RDL 121 are configured to electrically couple IC chips 101 and 102 to each other and to through-silicon vias 122, which are formed in interposer 120 and are described below. RDL 121 generally includes ground, power, and signal connections to each of IC chips 101 and 102, and is formed on surface 125 of interposer 120. Through-silicon vias 122 are electrically coupled to solder bumps 131, 132, and 133, which are formed on an opposite side of interposer 120 from RDL 121, i.e., surface 127. In this way, through-silicon vias 122 distribute ground, power, and signal connections coupled to solder bumps 131, 132, and 133. Solder bumps 131, 132, and 133, may be much more widely spaced than the solder microbumps used to electrically couple IC chips 101 and 102 to interposer 120 or the electrical interconnects formed in RDL 121.

Interposer 120 acts as an intermediate layer or structure in microelectronic package 100 that provides electrical connections between IC chips 101 and 102, any other semiconductor chips mounted on interposer 120, and packaging substrate 130. In some embodiments, interposer 120 is formed from a semiconductor substrate, such as a silicon wafer, and may be ground down to have a thickness on the order of 100 microns. The electrical connections between IC chips 101 and 102 and packaging substrate 130 are configured to facilitate high-speed propagation of signals between IC chips 101 and 102 and packaging substrate 130. Such electrical connections include the electrical interconnects of RDL 121 and through-silicon vias 122.

RDL 121 may be formed on surface 125 of interposer 120 using wafer-level deposition, patterning, and etching processes, i.e., processes that are generally performed on a complete semiconductor wafer or other substrate. In this way, RDL 121 for a plurality of microelectronic packages is formed simultaneously on a complete semiconductor substrate, and the semiconductor substrate is subsequently singulated into individual interposer elements, such as interposer 120, with RDL 121 already formed thereon.

Through-silicon vias 122 are "micro vias" formed through interposer 120, and in some embodiments may be on the order of 10 to 20 microns in diameter. Through-silicon vias 122 may be bumped with a conductive material such, as solder, for making electrical connections directly to IC chips 101 and 102 and/or to the electrical interconnects of RDL 121. RDL 121 and through-silicon vias 122 effectively provide very short electrical connections between IC chips 101 and 102 and to packaging substrate 130.

Packaging substrate 130 is a rigid and thermally insulating substrate on which interposer 120 is mounted that provides microelectronic package 100 with structural rigidity. In some embodiments, packaging substrate 130 is an organic laminate substrate and is composed of a stack of insulative layers or laminates that are built up on the top and bottom surfaces of a core layer. Packaging substrate 130 also provides an electrical interface for routing input and output signals and power from IC chips 101 and 102 and electrical connections 135. Electrical connections 135 provide electrical connections between microelectronic package 100 and a printed circuit board or other mounting substrate external to microelectronic package 100. Electrical connections 135 may be any technically feasible chip package electrical connection known in the art, including a ball-grid array (BGA), a pin-grid array (PGA), and the like.

Solder bumps 131, 132, and 133 are solder bumps formed on surface 127 of interposer 120. According to embodiments of the present invention, solder bumps 131, 132, and 133 are configured to reliably provide mechanical support to interposer 120 during operation of microelectronic package 100 despite the relatively large size of interposer 120. Specifically, the solder bumps formed on surface 127 include a first group of solder bumps coupled to a peripheral region of surface 127 (solder bumps 131 in FIG. 1) and a second group of solder bumps coupled to a center region of surface 127 (solder bumps 133 in FIG. 1). Each of solder bumps 131 in the first group has a diameter substantially equal to a first value, and each of solder bumps 133 in the second group has a diameter substantially equal to a second value, where the first value is greater than the second value. Furthermore, in some embodiments, a third group of solder bumps (solder bumps 132 in FIG. 1) may also be formed on surface 127 that are disposed between the peripheral region and the center region of surface 127, each solder bump in the third group having a diameter that is between the first value and the second value.

As shown, solder bumps 131 are significantly larger in diameter than solder bumps 133. Consequently, solder bumps 131 can withstand significantly more mechanical stress caused by mismatch between the coefficient of thermal expansion (CTE) of interposer 120 and the CTE of packaging substrate 130. For example, interposer 120 may have a CTE of approximately 2.5 ppm/° C. while the bulk material of packaging substrate 130 may have a CTE of 15 ppm/° C. Thus, because the organic laminate material in packaging substrate 130 expands significantly more when heated than the semiconductor material in interposer 120, substantial mechanical stresses result when heating occurs during operation of microelectronic package 100. Furthermore, such stresses generally have the greatest magnitude in the peripheral region of surface 127, since the greatest relative displacement between packaging substrate 130 and interposer 120 occurs therein. Because solder bumps 131 in this peripheral region are significantly larger in diameter than solder bumps 133 in the center region of surface 127, solder bumps 131 can withstand the higher mechanical stress that occurs in the peripheral region without cracking or delaminating from packaging substrate 130 or interposer 120.

Generally, a large number of input/output (I/O) signals are associated with IC chips 101 and 102, and these I/O electrical connections may be routed from IC chips 101 and 102 using solder microbumps 128. However, the center-to-center spacing of solder microbumps 128, also referred to as the microbump bump pitch, can be on the order of a few 10s of microns, which is generally too small for electrically coupling IC chip 101 or IC chip 102 to a packaging substrate such as packaging substrate 130. Instead, RDL 121 formed on interposer 120 is configured with electrical interconnects that distribute I/O electrical connections from the closely spaced solder microbumps 128 to a more widely spaced pattern suitable for interfacing with packaging substrate 130. For example, solder bumps 131, 132, and 133 may have a bump pitches on the order of about 200 to 300 microns.

Because a large portion of the I/Os associated with IC chip 101 and 102 are directly routed to and from IC chips 101 and 102 using RDL 121, interposer 120 generally includes significantly fewer I/Os than a comparably sized processor or memory chip. Because of this, interposer 120 can generally accommodate the routing of I/Os from IC chips 101 and 102 to packaging substrate 130 without the high routing capability required by conventional processors and memory chips. In other words, the number of electrical connections for I/Os between interposer 120 and packaging substrate 130 does not need to be maximized by positioning smaller and mechanically weaker solder bumps in some or all of the peripheral region of surface 127. Instead, the peripheral region of surface 127, which during operation is typically the high-stress portion of interposer 120, can have larger solder bumps disposed thereon, such as solder bumps 131. The center region of surface 127 is typically the low-stress portion of interposer 120, and can have small solder bumps disposed thereon, such as solder bumps 133, without the reliability of microelectronic package 100 being significantly reduced.

Figure 2:
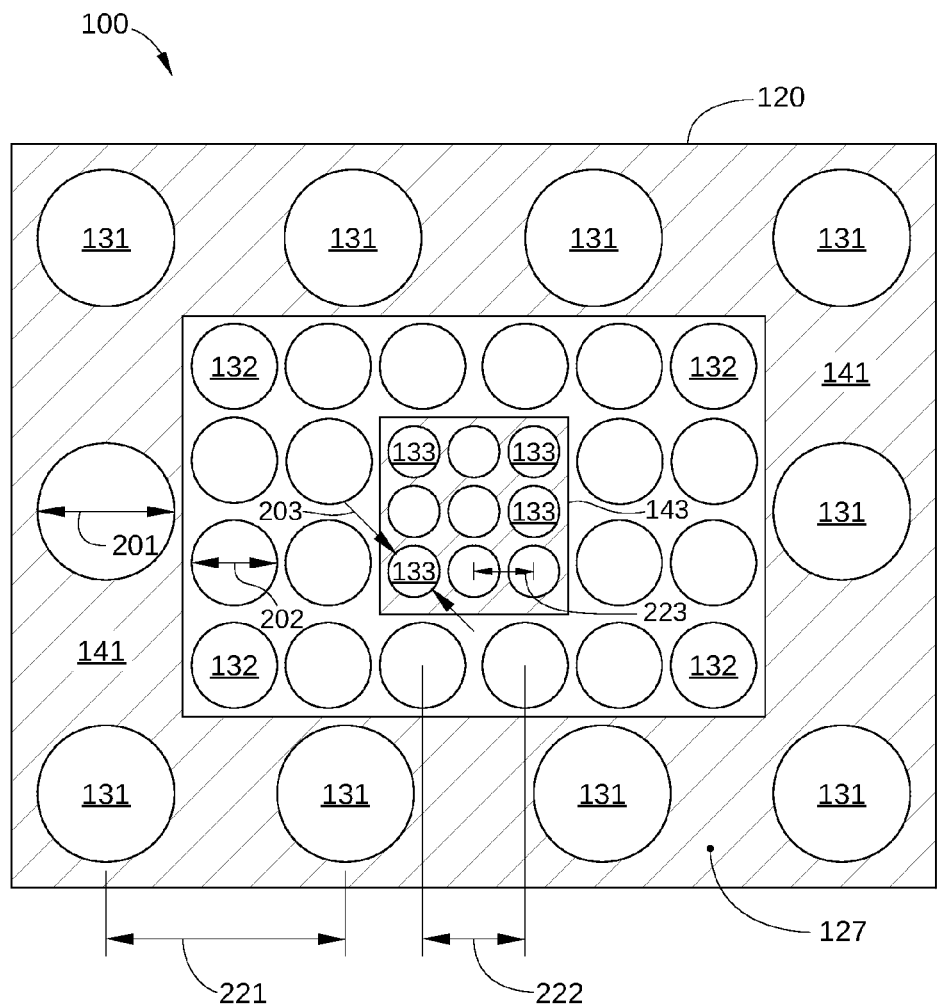
FIG. 2 is a schematic plan view of a surface of an interposer with solder bumps arranged thereon, according to one embodiment of the present invention.

FIG. 2 is a schematic plan view of surface 127 of interpose 120 with solder bumps arranged thereon, according to one embodiment of the present invention. Solder bumps 131, 132, and 133 are arranged on surface 127 as shown, with solder bumps 131 disposed in a peripheral region 141 (outer cross-hatched area), solder bumps 133 disposed in a center region 143 (inner cross-hatched area), and solder bumps 132 disposed between peripheral region 141 and center region 143. As described above, solder bumps 131 have a diameter 201 that is significantly larger than diameter 203 of solder bumps 133. In addition, solder bumps 132 have a diameter 202 that is greater than diameter 203 and less than diameter 201.

Solder bumps 131, 132, and 133 are generally arranged on surface 127 according to bump density rules well-known in the art. Thus, diameters of solder bumps 131, 132, and 133, as well as the bump pitch separating solder bumps 131, 132, and 133, may be determined based on various factors, including number of I/O connections, predicted operating temperature of microelectronic package 100, solder bump material properties, and the dimensions of interposer 120. Given these factors, one of skill in the art can readily select diameters and bump pitches suitable for a particular configuration of microelectronic package 100 so that solder bumps 131, 132, and 133 have a target mechanical strength.

In one embodiment, solder bumps 131 are arranged with a bump pitch 221 of about 270 microns or more, solder bumps 132 are arranged with a bump pitch 222 of about 220 microns or more, and solder bumps 133 are arranged with a bump pitch of about 180 microns or more. In addition, solder bumps 131 have a diameter of approximately 120 microns to 150 microns, solder bumps 132 have a diameter of approximately 95 microns to 125 microns, and solder bumps 133 have a diameter of approximately 70 microns to 110 microns. Other diameters for solder bumps 131, 132, and 133 and different bump pitches than those listed above may also be used without exceeding the scope of the invention.

As noted above, the number of I/Os routed from interposer 120 to packaging substrate 130 is generally much less than the number of I/Os routed to a packaging substrate from a conventional processor or memory chip of similar size. Consequently, in some embodiments, some of the solder bumps on surface 127 may be dummy bumps, which are solder bumps that do not electrically couple a ground, power, or signal connection to packaging substrate 130. Such dummy bumps mechanically support interposer 120 and are positioned so that mechanical stresses in microelectronic package 100 that occur during operation are substantially uniformly distributed among the solder bumps formed on surface 127. For example, in some embodiments, one or more of solder bumps 131 are dummy solder bumps. In one such embodiment, all or most of solder bumps 131 may be dummy bumps. In other embodiments, one or more of solder bumps 132 may be dummy solder bumps.

Figure 3:
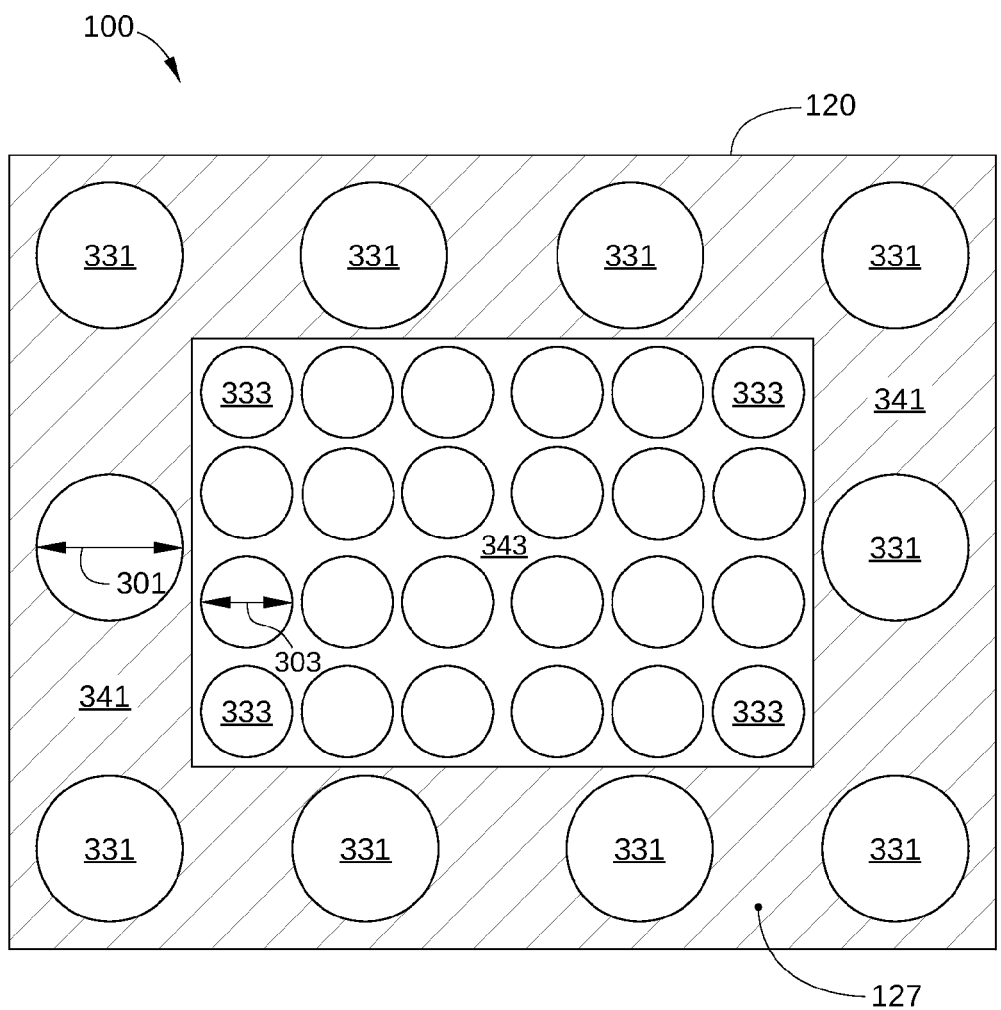
FIG. 3 is a schematic plan view of a surface of an interposer with solder bumps arranged thereon, according to another embodiment of the present invention.

In the embodiment illustrated in FIG. 2, three groups of solder bumps are shown, where each group includes solder bumps having one particular diameter. In some embodiments, more or fewer groups of solder bumps may be formed on surface 127, where each group includes solder bumps that have a particular diameter. FIG. 3 illustrates one such embodiment. FIG. 3 is a schematic plan view of surface 127 of interposer 120 with solder bumps arranged thereon, according to another embodiment of the present invention. As shown, two groups of solder bumps are formed on surface 127: solder bumps 331 in a peripheral region 341 (cross-hatched area) and solder bumps 333 in a center region 343. Solder bumps 331 are substantially equal in diameter, each having a diameter 301, and solder bumps 333 are also substantially equal in diameter, each having a diameter of 303, where diameter 301 is significantly larger than diameter 303.

Figure 4:
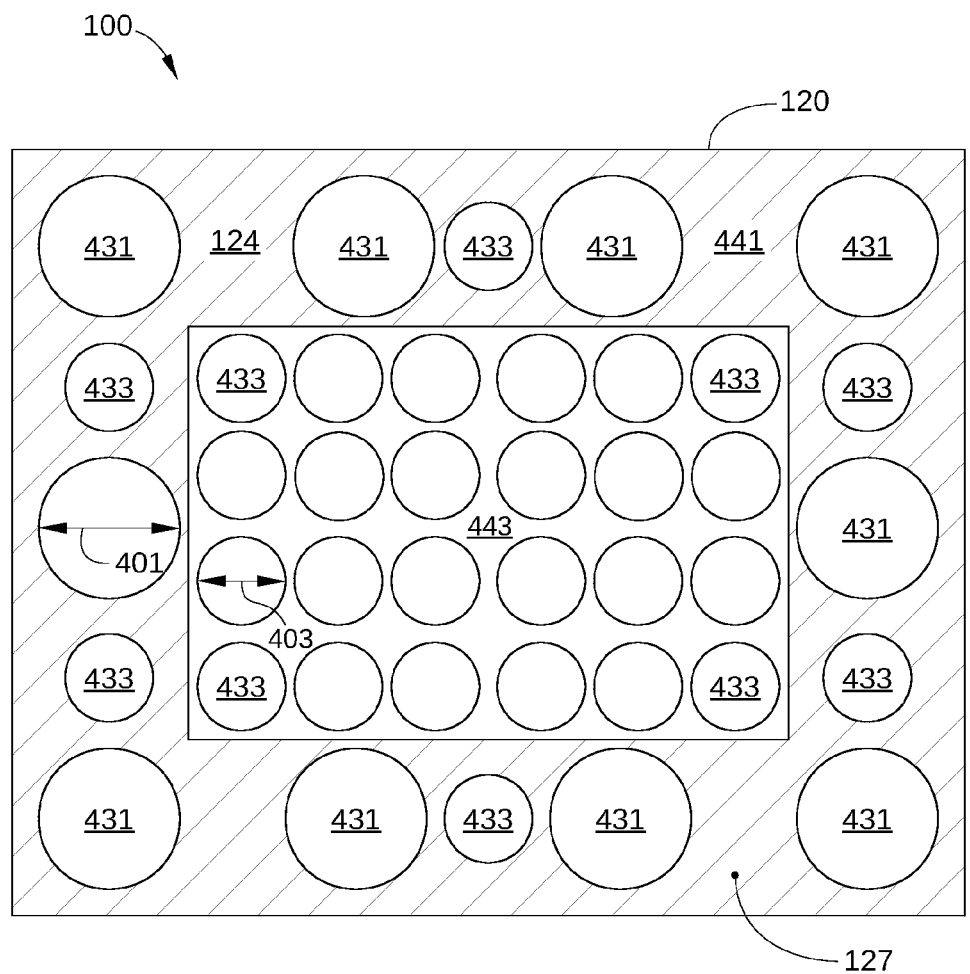
FIG. 4 is a schematic plan view of a surface of an interposer with solder bumps arranged thereon, according to yet another embodiment of the present invention.

In the embodiments illustrated in FIGS. 2 and 3, each group of solder bumps of a particular diameter are formed on surface 127 in non-overlapping regions, such as peripheral region 141 and center region 143 in FIG. 1 and peripheral region 341 and center region 343 in FIG. 2. In some embodiments, solder bumps having different diameters may be disposed in the same region. FIG. 4 illustrates one such embodiment. FIG. 4 is a schematic plan view of surface 127 of interposer 120 with solder bumps arranged thereon, according to yet embodiment of the present invention. As shown, solder bumps 431 have a diameter 401 and are formed in a peripheral region 441, and solder bumps 433 have a diameter 403 and are formed in both peripheral region 441 and a center region 443. Thus, in peripheral region 441, solder bumps having diameter 401 and solder bumps having diameter 403 are present. Because center region 443 is a relatively low-stress region of interposer 120, larger diameter solder bumps 431 are not located in center region 443. Other combinations of different diameter solder bumps formed on surface 127 also fall within the scope of the invention.

Figure 5:
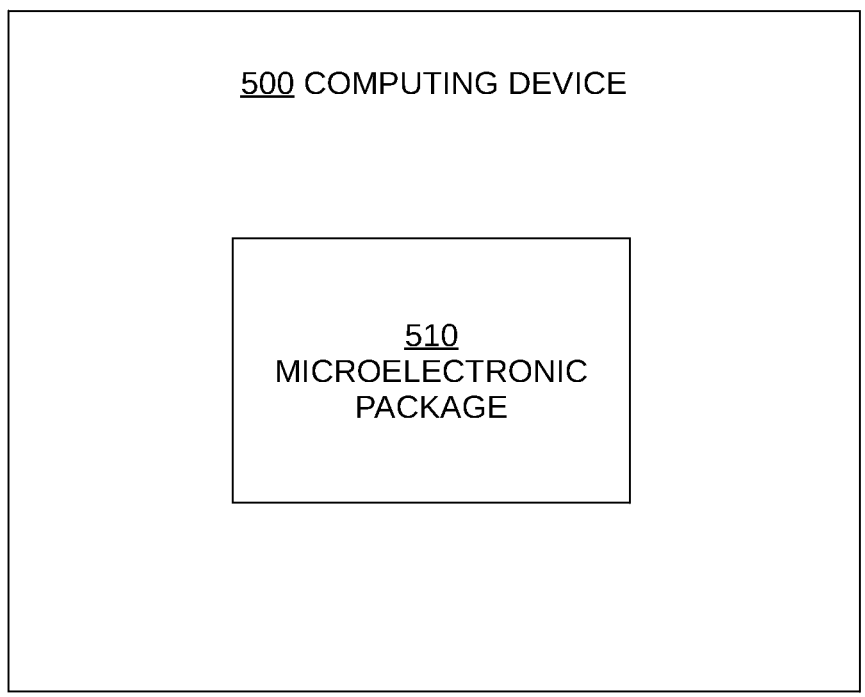
FIG. 5 illustrates a computing device in which one or more embodiments of the present invention can be implemented.

FIG. 5 illustrates a computing device in which one or more embodiments of the present invention can be implemented. Specifically, FIG. 5 is a block diagram of a computing device 500 with a microelectronic package 510 configured according to an embodiment of the present invention. Computing device 500 may be a desktop computer, a laptop computer, a smart-phone, a digital tablet, a personal digital assistant, or other technically feasible computing device. Microelectronic package 510 is substantially similar in organization and operation to microelectronic package 100, described above in conjunction with FIGS. 1-4, and may include a CPU, a GPU, an application processor or other logic device, volatile memory, such as random access memory (RAM), non-volatile memory, such as flash memory, a system-on-chip (SOC), or any other IC chip-containing device.

In sum, embodiments of the invention set forth a microelectronic package with a stress-tolerant solder bump pattern. Larger diameter solder bumps for coupling an interposer to a packaging substrate are positioned on a peripheral surface of the interposer and smaller diameter solder bumps are positioned on a center surface of the interposer. An advantage of the above-described embodiment is that the solder bumps positioned in the peripheral region can more reliably withstand the higher mechanical stresses that occur in this peripheral region during operation.

While the foregoing is directed to embodiments of the present invention, other and further embodiments of the invention may be devised without departing from the basic scope thereof, and the scope thereof is determined by the claims that follow.

I claim:

1. A microelectronic package, comprising:
   a semiconductor die mounted on a first side of an interposer that is formed from a semiconductor substrate;
   a first group of solder bumps coupled to a peripheral region of a second side of the interposer, wherein the first side of the interposer is opposite to the second side of the interposer; and
   a second group of solder bumps coupled to a center region of the second side of the interposer,
   wherein each solder bump in the first group has a diameter substantially equal to a first value, each solder bump in the second group has a diameter substantially equal to a second value, and the first value is greater than the second value, and wherein the first group of solder bumps and the second group of solder bumps are disposed within the microelectronic package.

2. The microelectronic package of claim 1, wherein the interposer has through-silicon vias formed therein.

3. The microelectronic package of claim 1, further comprising a third group of solder bumps that are coupled to the second side of the interposer and disposed between the peripheral region and the center region, each solder bump in the third group having a diameter that is substantially equal to a third value.

4. A microelectronic package, comprising:
   a semiconductor die mounted on a first side of an interposer that is formed from a semiconductor substrate;
   a first group of solder bumps coupled to a peripheral region of a second side of the interposer, wherein the first side of the interposer is opposite to the second side of the interposer; and
   a second group of solder bumps coupled to a center region of the second side of the interposer,
   wherein each solder bump in the first group has a diameter substantially equal to a first value, each solder bump in the second group has a diameter substantially equal to a second value, and the first value is greater than the second value, and further comprising a third group of solder bumps that are coupled to the second side of the interposer and disposed between the peripheral region and the center region, each solder bump in the third group having a diameter that is substantially equal to a third value, and wherein the third value is greater than the second value and the first value is greater than the third value.

5. A microelectronic package, comprising:
   a semiconductor die mounted on a first side of an interposer that is formed from a semiconductor substrate;
   a first group of solder bumps coupled to a peripheral region of a second side of the interposer, wherein the first side of the interposer is opposite to the second side of the interposer; and
   a second group of solder bumps coupled to a center region of the second side of the interposer,
   wherein each solder bump in the first group has a diameter substantially equal to a first value, each solder bump in the second group has a diameter substantially equal to a second value, and the first value is greater than the second value, and wherein the first group includes one or more dummy solder bumps that are not electrically coupled to the semiconductor die.

6. A microelectronic package, comprising:
   a semiconductor die mounted on a first side of an interposer that is formed from a semiconductor substrate;
   a first group of solder bumps coupled to a peripheral region of a second side of the interposer, wherein the first side of the interposer is opposite to the second side of the interposer; and
   a second group of solder bumps coupled to a center region of the second side of the interposer,
   wherein each solder bump in the first group has a diameter substantially equal to a first value, each solder bump in the second group has a diameter substantially equal to a second value, and the first value is greater than the second value, and wherein the solder bumps of the first group are separated from each other by a first bump pitch, the solder bumps of the second group are separated from each other by a second bump pitch, and the first bump pitch is greater than the second bump pitch.

7. The microelectronic package of claim 6, wherein the first bump pitch is greater than or equal to about 270 microns.

8. The microelectronic package of claim 7, wherein the first value is at least about 120 microns and no greater than about 150 microns.

9. The microelectronic package of claim 6, wherein the second bump pitch is greater than or equal to about 180 microns.

10. The microelectronic package of claim 9, wherein the second value is at least about 95 microns and no greater than about 125 microns.

11. The microelectronic package of claim 6, further comprising a third group of solder bumps disposed on the second side of the interposer between the first group and the second group, wherein each solder bump in the third group has a diameter substantially equal to a third value that is greater than the second value and less than the third value.

12. The microelectronic package of claim 11, wherein the solder bumps of the third group are separated from each other by a third bump pitch that is greater than the second bump pitch.

13. The microelectronic package of claim 12, wherein the third bump pitch is greater than or equal to about 220 microns and the third value is at least about 70 microns and no greater than about 110 microns.

14. The microelectronic package of claim 1, further comprising an additional semiconductor die mounted on the first side of the interposer.

15. The microelectronic package of claim 14, wherein the additional semiconductor die is electrically coupled to the semiconductor die with interconnects that are formed on the first side of the interposer.

16. The microelectronic package of claim 1, wherein the first group of solder bumps and the second group of solder bumps are configured to couple the interposer to a packaging substrate.

17. A computing device, comprising:
   a microelectronic package that includes:
      a semiconductor die mounted on a first side of an interposer that is formed from a semiconductor substrate;
      a first group of solder bumps coupled to a peripheral region of a second side of the interposer, wherein the first side of the interposer is opposite to the second side of the interposer; and
      a second group of solder bumps coupled to a center region of the second side of the interposer,
   wherein each solder bump in the first group has a diameter substantially equal to a first value, each solder bump in the second group has a diameter substantially equal to a second value, and the first value is greater than the second value, and wherein the first group of solder bumps and second group of solder bumps are disposed within the microelectronic package.

18. The microelectronic package of claim 17, wherein the first group includes one or more dummy solder bumps that are not electrically coupled to the semiconductor die.

19. The microelectronic package of claim 17, wherein the solder bumps of the first group are separated from each other by a first bump pitch, the solder bumps of the second group are separated from each other by a second bump pitch, and the first bump pitch is greater than the second bump pitch.

20. The microelectronic package of claim 17, wherein the first group of solder bumps and the second group of solder bumps are configured to couple the interposer to a packaging substrate.

\* \* \* \* \*